United States Patent
Levesque

(10) Patent No.: US 7,109,897 B1
(45) Date of Patent: Sep. 19, 2006

(54) POWER AMPLIFIER CONTROL REDUCING OUTPUT POWER VARIATION

(75) Inventor: Chris Levesque, Fountain Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/245,851

(22) Filed: Oct. 7, 2005

(51) Int. Cl.
*H03M 7/40* (2006.01)
*H03G 3/10* (2006.01)
*H04B 1/04* (2006.01)

(52) U.S. Cl. .......................... 341/67; 341/65; 330/285; 330/296; 455/127

(58) Field of Classification Search ............ 341/60–70; 330/260–296; 455/126, 127
See application file for complete search history.

(56) References Cited

U.S. PATENT DOCUMENTS

| | | | |
|---|---|---|---|
| 6,665,525 B1 | 12/2003 | Dent et al. | 455/108 |
| 6,701,138 B1 * | 3/2004 | Epperson et al. | 455/572 |
| 6,917,245 B1 * | 7/2005 | Dupuis et al. | 330/279 |
| 7,058,374 B1 * | 6/2006 | Levesque et al. | 330/297 |

* cited by examiner

Primary Examiner—Lam T. Mai
(74) Attorney, Agent, or Firm—Withrow & Terranova, PLLC

(57) ABSTRACT

Power control circuitry for providing a variable supply voltage to power amplifier circuitry in such a manner as to reduce or essentially eliminate variations in output power due to variations in load impedance is provided. The power control circuitry includes a voltage regulator for providing the variable supply voltage to the power amplifier circuitry, current detection circuitry, correction circuitry, and combiner circuitry. In operation, the current detection circuitry provides a signal indicative of an actual current provided to the power amplifier circuitry from the voltage regulator. The correction circuitry provides a correction signal based on a comparison of the signal indicative of the actual current and a signal indicative of a reference current. The combiner circuitry operates to combine the correction signal and the adjustable power control signal to provide the corrected adjustable power control signal to the voltage regulator.

20 Claims, 6 Drawing Sheets

POWER AMPLIFIER CONTROL REDUCING OUTPUT POWER VARIATION

FIELD OF THE INVENTION

The present invention relates to power amplifier control, and more specifically relates to power amplifier control reducing variation in the output power of the power amplifier due to load variations.

BACKGROUND OF THE INVENTION

The output power of mobile terminals, such as mobile phones, Personal Digital Assistants (PDAs), and the like, is controlled by a power amplifier in the transmit chain. For open loop power amplifiers, the output power of the power amplifier, and thus the mobile terminal, is a function of the load impedance seen at the output of the power amplifier. Ideally, the load impedance is a constant load. However, in reality, there are variations in the load impedance due to variations in the impedance of the antenna of the mobile terminal caused by proximity of the antenna to foreign metallic objects and the user's body. For open loop power amplifiers, the variations in the load impedance result in variations in the output power of the power amplifier. such output power variations decrease the quality of service (QoS), increase the probability of dropped calls in fringe areas, increase the liability of mobile terminal manufactures in terms of tolerated output power versus Skin Absorption Ratio (SAR), and increase the peak current of the power amplifier. Thus, there remains a need for power amplifier control circuitry that reduces or eliminates output power variations due to variations in load impedance.

SUMMARY OF THE INVENTION

The present invention provides power control circuitry for providing a variable supply voltage to power amplifier circuitry in such a manner as to reduce or essentially eliminate variations in output power due to variations in load impedance. The power control circuitry includes a voltage regulator for providing the variable supply voltage to the power amplifier circuitry, current detection circuitry, correction circuitry, and combiner circuitry. In operation, the current detection circuitry provides a signal indicative of an actual current provided to the power amplifier circuitry from the voltage regulator. Since the output power of the power amplifier circuitry varies as the load impedance varies, the actual current also varies. The correction circuitry provides a correction signal based on a comparison of the signal indicative of the actual current and a signal indicative of a reference current. The reference current is a function of an adjustable power control signal provided to the power control circuitry to control the supply voltage, and thus the output power, of the power amplifier circuitry. The combiner circuitry operates to combine the correction signal and the adjustable power control signal to provide the corrected adjustable power control signal to the voltage regulator. As a result, the output power of the power amplifier circuitry is essentially equal to an ideal output power corresponding to the adjustable power control signal as the load impedance varies.

In one embodiment, the correction circuitry includes a ratio calculator and a square root extractor. In general, the ratio calculator provides a comparison signal based on calculating a ratio, $\beta I_{REF}/\alpha I_{PA}$, where $I_{REF}$ is the reference current, $I_{PA}$ is the actual current, $\beta I_{REF}$ is the signal indicative of the reference current, and $\alpha I_{PA}$ is the signal indicative of the actual current. The values $\alpha$ and $\beta$ are predetermined such that the ratio is essentially equal to 1 when the load impedance is equal to an ideal load impedance. The square root extractor provides the correction signal based on calculating the square root of the comparison signal. In this embodiment, the combiner circuitry includes multiplier circuitry that provides the corrected adjustable power control signal by multiplying the adjustable power control signal and the correction signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
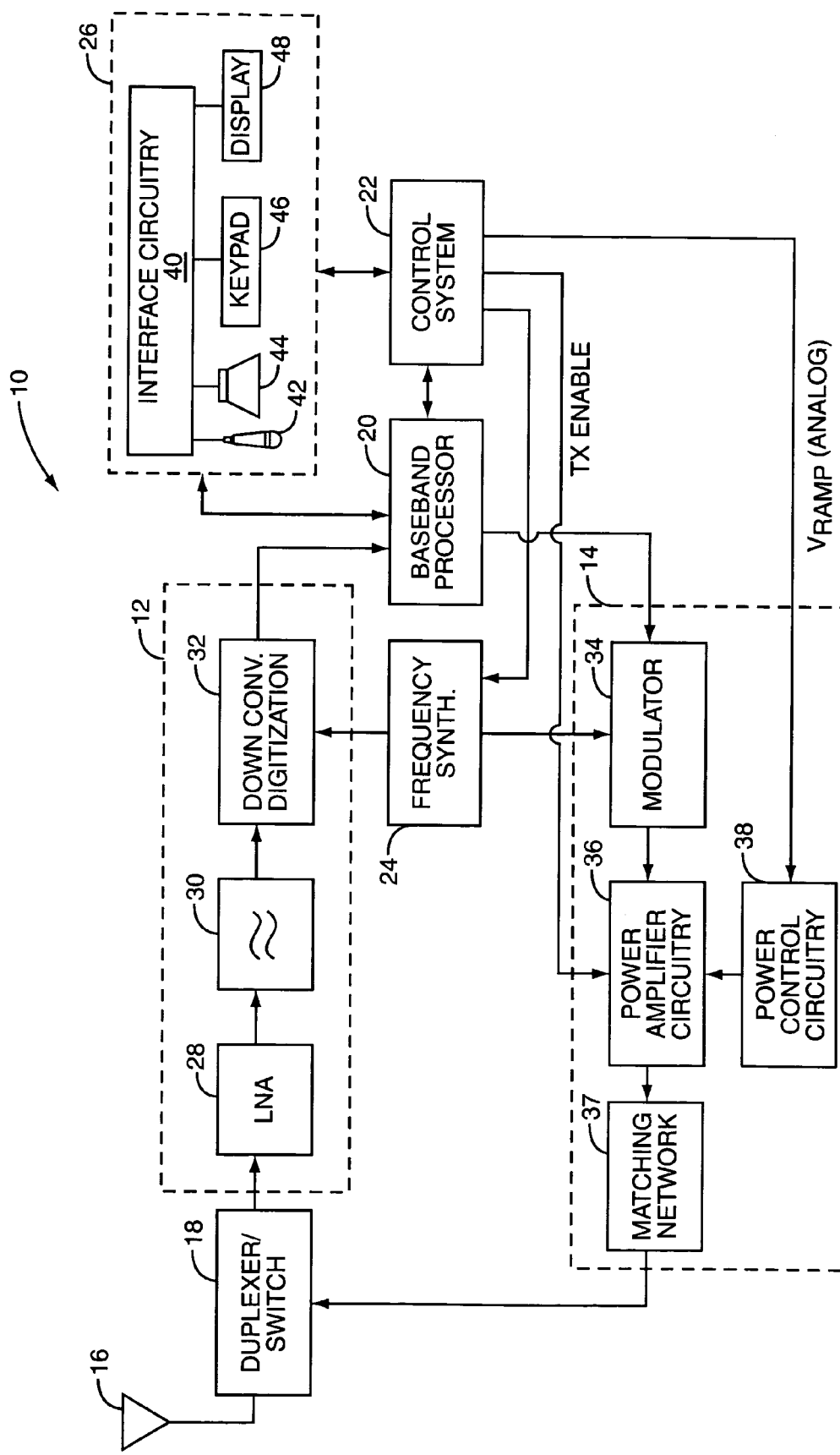
FIG. 1 illustrates an exemplary mobile terminal including the power control circuitry of the present invention.

The present invention is preferably incorporated in a mobile terminal 10, such a mobile telephone, personal digital assistant, personal computer, or the like. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission from the antenna 16. A matching network 37 operates to provide optimum power transfer between the power amplifier circuitry 36 and the antenna 16, as described below in more detail.

As described in further detail below, the power amplifier circuitry 36 provides gain for the signal to be transmitted under control of power control circuitry 38, which is preferably controlled by the control system 22 using an adjustable power control signal ($V_{RAMP}$). Further, according to the present invention, the power control circuitry 38 operates to reduce or essentially eliminate variations in output power of the power amplifier circuitry 36 due to variations in the load impedance.

It should be noted that in one embodiment, the modulator 34 may be a polar modulator providing amplitude and phase components of a polar modulation signal. In this embodiment, the amplitude component may be combined with the adjustable power control signal ($V_{RAMP}$), and the combined signal provided to the power control circuitry 38. For an exemplary embodiment of a polar modulator, see commonly owned and assigned U.S. patent application Ser. No. 10/139,560, entitled DIRECT DIGITAL POLAR MODULATOR, filed on May 6, 2002, which is hereby incorporated by reference in its entirety.

In one embodiment, the bias for the power amplifier circuitry 36 is relatively stable regardless of power, and varying the voltage supplied to the power amplifier circuitry 36 controls actual power levels. The control system 22 may also provide a transmit enable signal (TX ENABLE) to effectively enable the power amplifier circuitry 36 during periods of transmission.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, address book information, or the like, as well as monitor call progress information.

Figure 2:
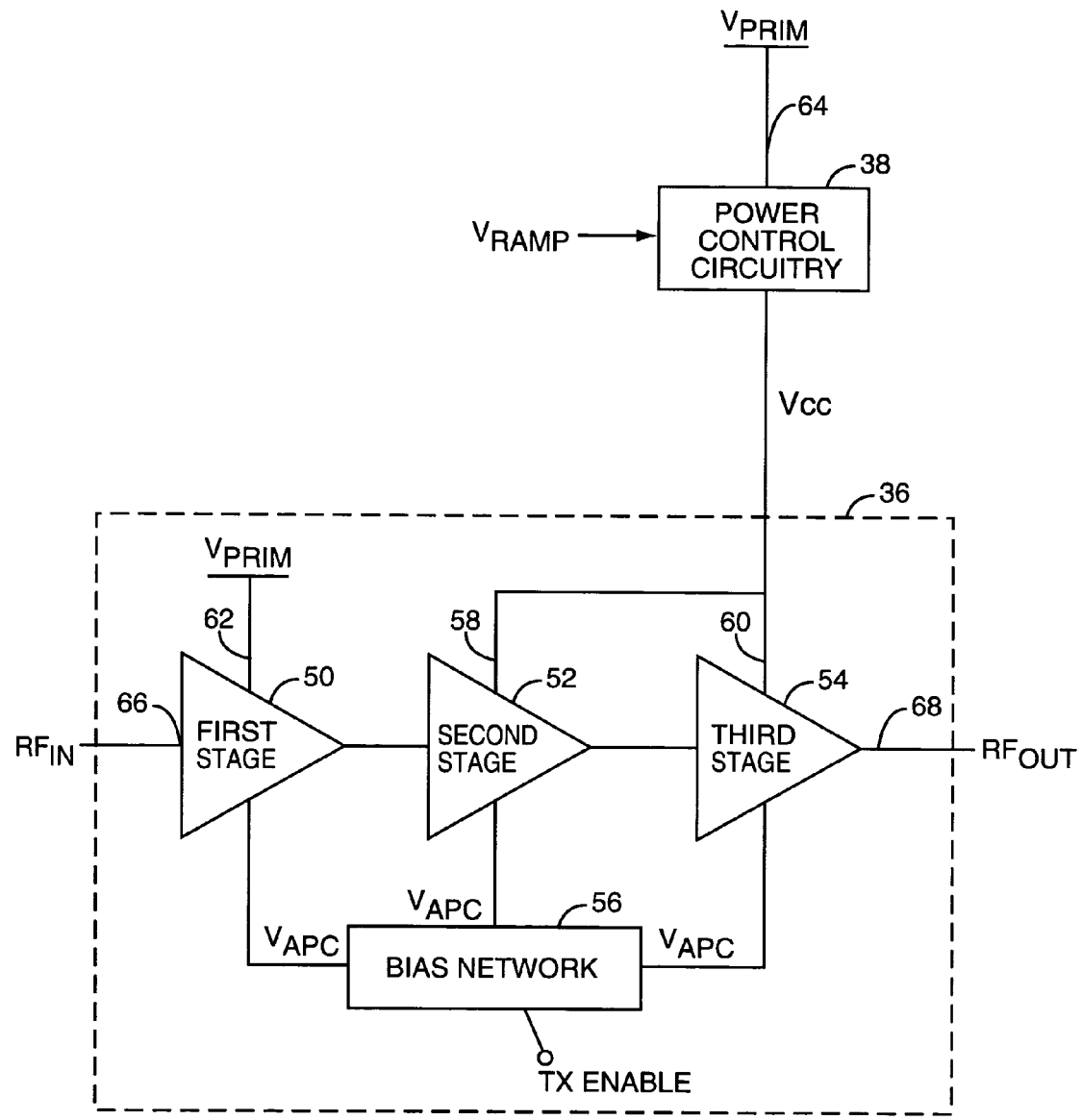
FIG. 2 illustrates the interconnection of the power control circuitry and an exemplary embodiment of the power amplifier circuitry of the mobile terminal according to one embodiment of the present invention.

Turning now to FIG. 2, the power amplifier circuitry 36 is associated with the power control circuitry 38. In one embodiment, the power amplifier circuitry 36 and the power control circuitry 38 are incorporated into a single module. In this exemplary embodiment, the power amplifier circuitry 36 includes three amplifier stages, a first amplifier stage 50, a second amplifier stage 52, and a third amplifier stage 54, as well as a bias network 56 providing bias for each of the three amplifier stages 50, 52, 54.

The adjustable power control signal ($V_{RAMP}$) is received by the power control circuitry 38 and used as a set-point voltage. Based on the adjustable power control signal ($V_{RAMP}$), the power control circuitry 38 controls a supply voltage ($V_{CC}$) provided to the rails 58, 60 of the second and third amplifier stages 52, 54, respectively. These rails 58, 60 will typically be the collectors or drains of bipolar or field effect transistors forming the respective amplifier stages, as will be appreciated by those skilled in the art. It should be noted that, in an alternative embodiment, the supply voltage ($V_{CC}$) may be provided to the rails 62, 58, 60 of the first, second, and third amplifier stages 50, 52, 54. As another alternative, the supply voltage ($V_{CC}$) may be provided to the rails 62, 58 of the first and second amplifier stages 50, 52.

In this embodiment, the rail 62 of the first amplifier stage 50 is connected directly to a fixed or primary voltage supply ($V_{PRIM}$), which will preferably also be connected to the terminal for the positive potential of a battery. The fixed or primary voltage supply ($V_{PRIM}$) is also preferably connected to an input terminal 64 of the power control circuitry 38. As noted, in one embodiment, the bias network 56 supplies a fixed bias to the three amplifier stages 50, 52, 54, regardless of the collector/drain supply voltage ($V_{CC}$) provided to the second and third amplifier stages 52, 54. The fixed bias incorporates traditional $V_{APC}$ signals, which are configured to maintain a constant bias. However, in another embodiment, the bias network 56 provides a constant bias to the first amplifier stage 50 and a variable bias that is reduced when the supply voltage ($V_{CC}$) is reduced to the second and third amplifier stages 52, 54.

The transmitter control signal (TX ENABLE) is a logic signal used to enable or disable the power amplifier circuitry 36 by removing the bias from each of the three amplifier stages 50, 52, 54. A radio frequency signal to be amplified ($RF_{IN}$) is provided at the input 66 of the first amplifier stage 50 and amplified by the three amplifier stages 50, 52, 54 to provide an amplified output signal ($RF_{OUT}$) at the output 68 of the third amplifier stage 54.

Figure 3:
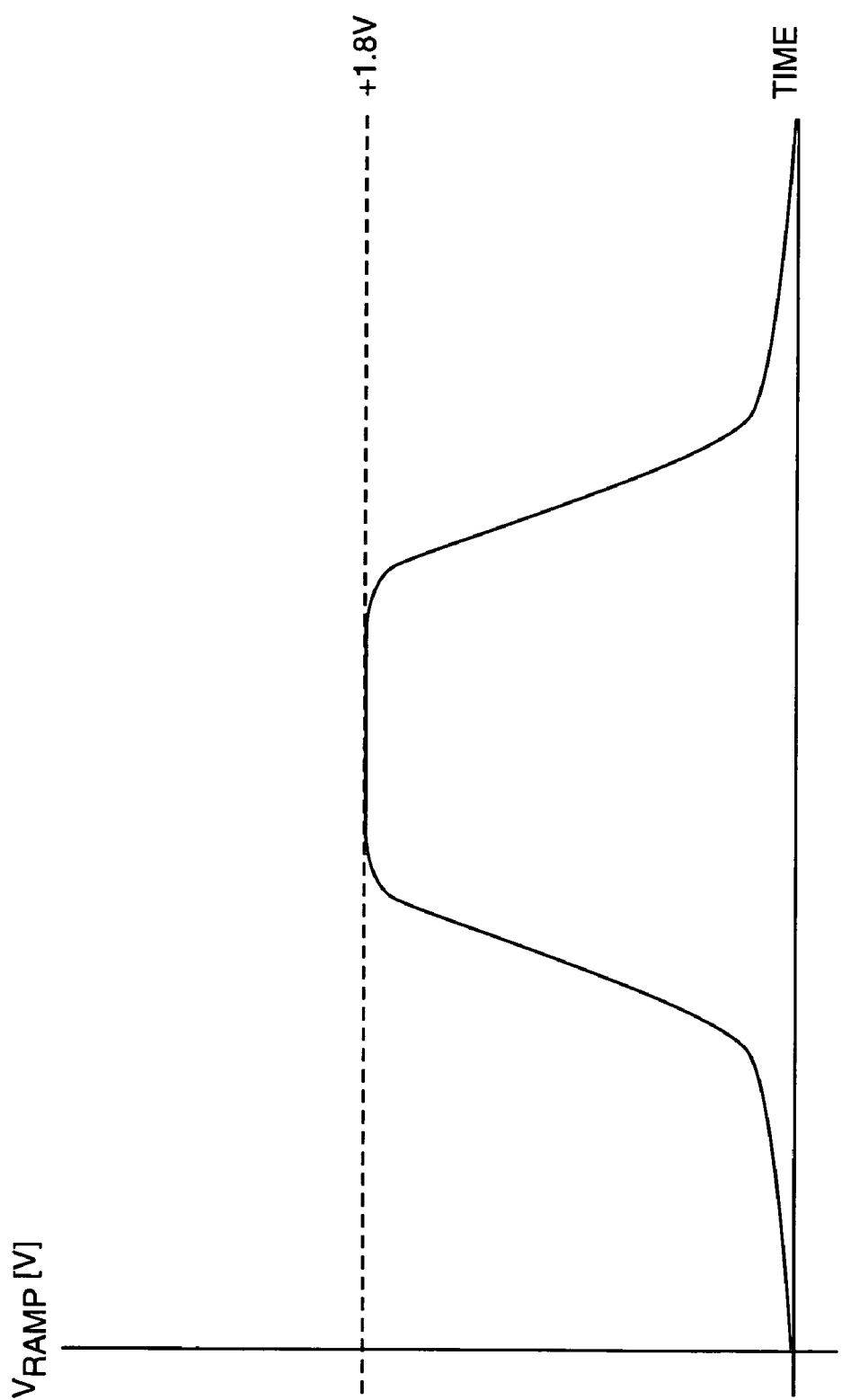
FIG. 3 is a graph that depicts an exemplary profile of an adjustable power control signal $V_{RAMP}$ provided to the power control circuitry according to one embodiment of the present invention.
Figure 4:
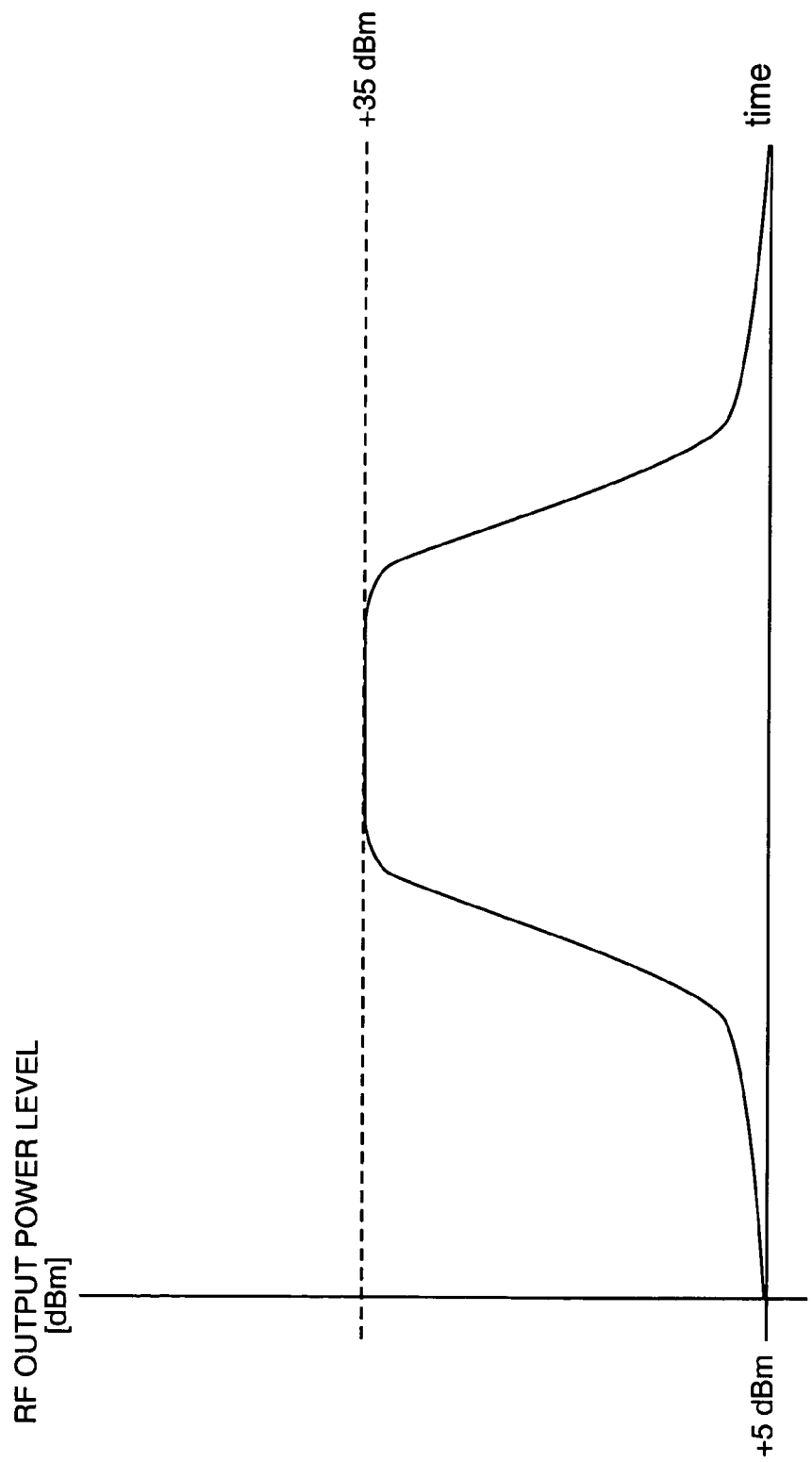
FIG. 4 is a graph that depicts an exemplary relationship between the output power of the power amplifier circuitry of the mobile terminal and the adjustable power control signal $V_{RAMP}$ of FIG. 3.

The voltage profile of an exemplary $V_{RAMP}$ signal is shown in FIG. 3. The current embodiment of the invention limits the $V_{RAMP}$ signal to +1.8V; however, other embodiments of the invention may use less or more voltage to drive the $V_{RAMP}$ input. Turning now to FIG. 4, the output power level as a function of the $V_{RAMP}$ signal of FIG. 3 is illustrated. Notably, the power level tracks the $V_{RAMP}$ signal and ranges from +5 dBm at the minimum to +35 dBm at the maximum for the preferred embodiment. It should be noted that FIGS. 3 and 4 should be considered exemplary rather than limiting.

It should be noted that the power control scheme discussed herein provides many benefits. For example, the supply voltage ($V_{CC}$) is preferably provided such that the second and third amplifier stages 52, 54 operate in saturation. As another example, by providing the fixed voltage ($V_{PRIM}$) to the first amplifier stage 50, the overall output noise power is not increased when the output power of the power amplifier circuitry 36 is decreased. These benefits, along with the many other benefits of this power control scheme, are discussed in detail in U.S. Pat. No. 6,701,138, entitled POWER AMPLIFIER CONTROL, issued Mar. 2, 2004, which is assigned to RF Micro Devices, Inc. of 7628 Thorndike Road, Greensboro, N.C. 27409 and is hereby incorporated herein by reference in its entirety.

Certain advantages may be realized by forming two or more of the amplifier stages 50, 52, 54 from a plurality of transistor cells arranged in parallel. For further information pertaining to the transistor arrays, reference is made to U.S. Pat. No. 5,608,353, entitled HBT POWER AMPLIFIER, issued Mar. 4, 1997; and U.S. Pat. No. 5,629,648, entitled HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. patent application Ser. No. 09/952,524, entitled AMPLIFIER POWER DETECTION CIRCUITRY, filed Sep. 14, 2001, the disclosure of which is hereby incorporated by reference in its entirety. Exemplary bias networks 56 capable of being used in association with the present invention are described in further detail in U.S. Pat. No. 6,313,705, entitled BIAS NETWORK FOR HIGH EFFICIENCY RF LINEAR AMPLIFIER, issued Nov. 6, 2001, which is also assigned to RF Micro Devices, Inc. and is hereby incorporated by reference in its entirety. Upon understanding the present invention, those skilled in the art will be able to construct any number of bias networks that are compatible with the present invention.

Figure 5:
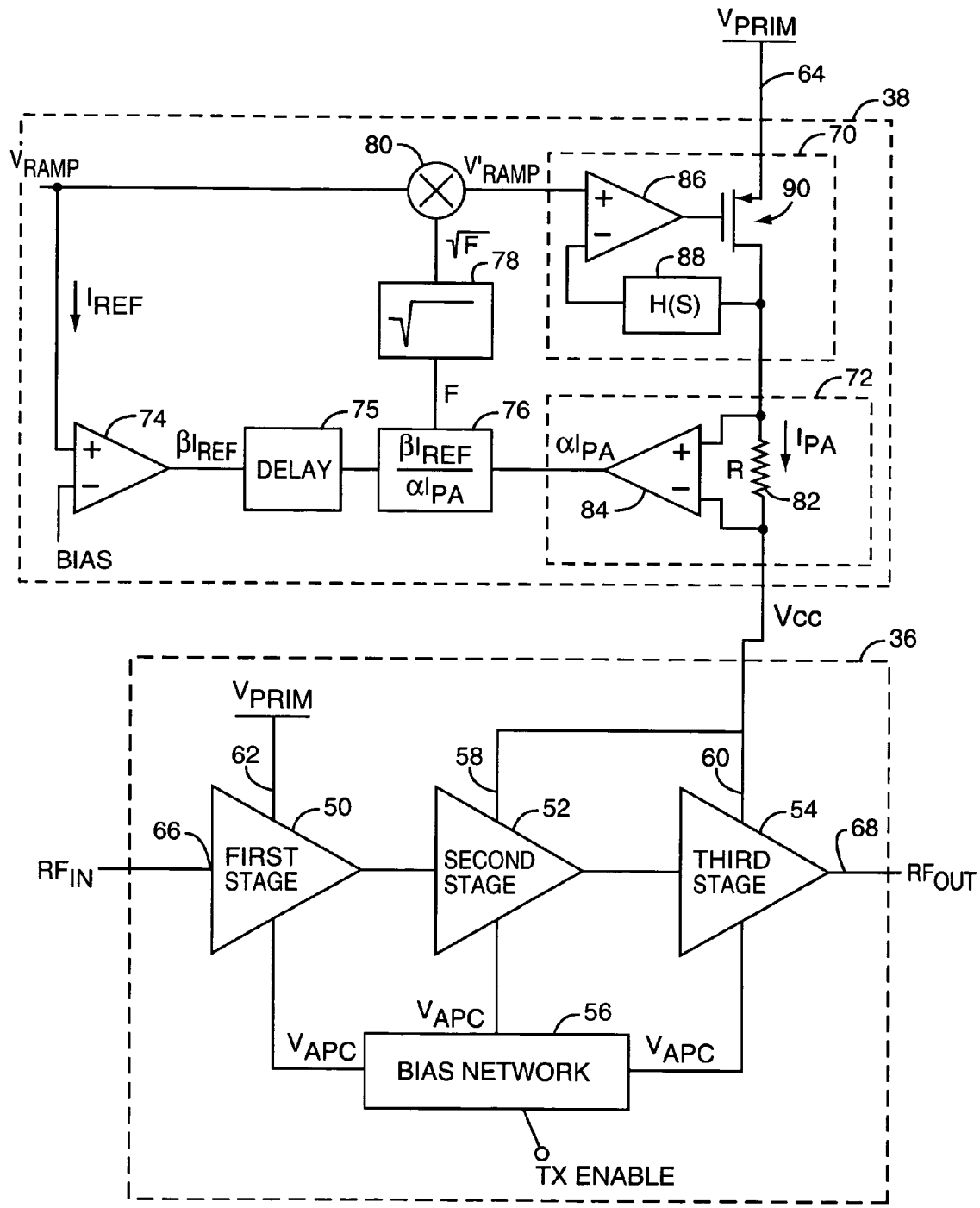
FIG. 5 illustrates a more detailed block diagram of the power control circuitry providing output power correction for variations in load impedance according to one embodiment of the present invention.

FIG. 5 is a detailed schematic of an exemplary embodiment of the power control circuitry 38 of the present invention. The power control circuitry 38 includes a voltage regulator 70, current detection circuitry 72, an amplifier 74, delay circuitry 75, a ratio calculator 76, a square root extractor 78, and a multiplier 80. The ratio calculator 76 and the square root extractor 78 are an exemplary embodiment of correction circuitry that, according to the present invention, operates to provide a correction signal to the multiplier 80 based on a comparison of a signal indicative of an actual current ($I_{PA}$) provided to the power amplifier circuitry 36 and a signal indicative of a reference current ($I_{REF}$).

More specifically, the exemplary embodiment of the current detection circuitry 72 includes a resistor 82 and an amplifier 84. The resistor 82 may be a bond wire coupling an output terminal of the power control circuitry 38 to an input of the power amplifier circuitry 36. However, the resistor 82 may be any resistive element coupling the voltage regulator 70 to the power amplifier circuitry 36. The amplifier 84 operates to provide a voltage ($\alpha I_{PA}$) indicative of the actual current ($I_{PA}$) based on a voltage differential across the resistor 82. The amplifier 74 operates to provide a voltage ($\beta I_{REF}$) indicative of a reference current ($I_{REF}$) based on amplifying the reference current ($I_{REF}$). The reference current ($I_{REF}$) is a function of the adjustable power control signal ($V_{RAMP}$). In this embodiment, the adjustable power control signal (VAMP) is coupled to a positive terminal (+) of the amplifier 74, and the reference current ($I_{REF}$) is the current flowing into the positive terminal (+) of the amplifier 74.

In order to compensate for a delay of the voltage regulator 70, the delay circuitry 75 delays the voltage ($\beta I_{REF}$) from the amplifier 74 and provides a delayed version of the voltage ($\beta I_{REF}$) to the ratio calculator 76. The voltage ($\alpha I_{PA}$) is also provided to the ratio calculator 76. It should be noted that $\alpha$ and $\beta$ are predetermined such that the voltages ($\alpha I_{PA}$, $\beta I_{REF}$) are essentially equal when a load impedance ($R_L$) provided by the matching network 37 (FIG. 1) at the output of the power amplifier circuitry 36 is equal to an ideal load. For example, the ideal load may be 1.85 ohms. Thus, in this example, $\alpha$ and $\beta$ are predetermined such that the voltages ($\alpha I_{PA}$, $\beta I_{REF}$) are essentially equal when the load impedance ($R_L$) at the output of the power amplifier circuitry 36 is 1.85 ohms. As will be apparent to one of ordinary skill in the art, the load impedance ($R_L$) is an impedance seen by the output of the power amplifier circuitry 36 due to the matching network 37. The load impedance ($R_L$) is often referred to as the power amplifier load line impedance or the power amplifier source impedance. The matching network 37 operates to match the load impedance ($R_L$), which for this example is 1.85 ohms, to a final output impedance seen at the antenna 16 (FIG. 1), which may be 50 ohms, such that optimum power transfer is achieved. The final load impedance seen at the antenna 16, and thus the load impedance ($R_L$), may deviate from the ideal load due to environmental factors such as the antenna 16 touching a user's skin or a foreign metal object.

The output of the ratio calculator 76, which is referred to herein as a "comparison signal," is provided to the square root extractor 78. As discussed below in more detail, the square root extractor 78 operates to convert the output of the ratio calculator 76 from the power domain ($V^2$) to the voltage domain, which is linear. It should be noted that the square root extractor 76 is implemented such that it calculates the square root of the comparison signal or an approximation thereof. The output of the square root extractor 78, which is referred to herein as a "correction signal," is provided to the multiplier 80, which operates to multiply the adjustable power control signal ($V_{RAMP}$) and the correction signal to provide a corrected adjustable power control signal ($V'_{RAMP}$).

In operation, the power control circuitry 38 operates to reduce or essentially eliminate variations in the output power of the power amplifier circuitry 36 due to variation in the load impedance at the output of the power amplifier circuitry 36. More specifically, the current detection circuitry 72 generates the voltage ($\alpha I_{PA}$), which is indicative of the actual current ($I_{PA}$), and thus the output power of the power amplifier circuitry 36. The ratio calculator 76 compares the voltage ($\alpha I_{PA}$) to the voltage ($\beta I_{REF}$) to provide a factor (F), which is more generally referred to as the comparison signal. As discussed below in more detail, the factor (F) is a factor by which the load impedance ($R_L$) changes from the ideal load, and also a factor by which the value $V_{CC}^2$ is to be adjusted to correct the output power of the power amplifier circuitry 36 for variations in the load impedance ($R_L$). When the load impedance ($R_L$) is the ideal load, such as 1.85 ohms, the voltage ($\alpha I_{PA}$) is essentially equal to the voltage ($\beta I_{REF}$) such that the factor (F) output by the ratio calculator 76 is 1. Thus, the correction signal ($\sqrt{F}$) provided by the square root extractor 78 is 1, and the corrected adjustable power control signal ($V'_{RAMP}$) is equal to the adjustable power control signal ($V_{RAMP}$).

However, when the load impedance ($R_L$) deviates from the ideal load, the voltage ($\alpha I_{PA}$) is no longer equal to the voltage ($\beta I_{REF}$). For example, if the load impedance ($R_L$) is greater than the ideal load, the actual current ($I_{PA}$), and thus the voltage ($\alpha I_{PA}$), decreases. Accordingly, the voltage ($\alpha I_{PA}$) is less than the voltage ($\beta I_{REF}$), the factor (F) output by the ratio calculator 76 is greater than 1, and the correction signal (√F) provided by the square root extractor 78 is also greater than 1. Thus, when the multiplier 80 multiplies the adjustable power control signal ($V_{RAMP}$) and the correction signal (√F), the corrected adjustable power control signal ($V'_{RAMP}$) is greater than the adjustable power control signal ($V_{RAMP}$). Consequently, the supply voltage ($V_{CC}$) increases, thereby increasing the actual current ($I_{PA}$) such that the voltage ($\alpha I_{PA}$) is again essentially equal to the voltage ($\beta I_{REF}$). As a result, the output power remains essentially equal to the output power for the ideal load.

Similarly, if the load impedance ($R_L$) is less than the ideal load, the actual current ($I_{PA}$), and thus the voltage ($\alpha I_{PA}$), increases. Consequently, the voltage ($\alpha I_{PA}$) is greater than the voltage ($\beta I_{REF}$), the factor (F) output by the ratio calculator 76 is less than 1, and the correction signal (√F) provided by the square root extractor 78 is also less than 1. Thus, when the multiplier 80 multiplies the adjustable power control signal ($V_{RAMP}$) and the correction signal (√F), the corrected adjustable power control signal ($V'_{RAMP}$) is less than the adjustable power control signal ($V_{RAMP}$). Consequently, the supply voltage ($V_{CC}$) decreases, thereby decreasing the actual current ($I_{PA}$) such that the voltage ($\alpha I_{PA}$) is again essentially equal to the voltage ($\beta I_{REF}$). As a result, the output power remains essentially equal to the output power for the ideal load.

The operation of the power control circuitry 38 may be mathematically described as follows. The following equations have been simplified for illustrative purposes and easier understanding.

$$V_{CC} \propto V_{RAMP}, \quad P_{OUT} = \frac{V_{CC}^2}{2 \cdot R_L}, \text{ and } I_{PA} = \frac{V_{CC}}{R_L}.$$

Thus, the actual current ($I_{PA}$) is inversely proportional to the load impedance ($R_L$), which for simplicity is assumed to be a load resistance. As noted above, the load impedance ($R_L$) is an impedance provided by the matching network 37 (FIG. 1) in order to match the source impedance of the power amplifier circuitry 38. The matching network 37 then provides matching between the load impedance ($R_L$) and the final load impedance seen at the antenna 16. As the load impedance ($R_L$) increases from the ideal load, the actual current ($I_{PA}$) decreases. As the load impedance ($R_L$) decreases from the ideal load, the actual current ($I_{PA}$) increases. By comparing the voltages ($\alpha I_{PA}$, $\beta I_{REF}$), the factor (F) by which the load impedance ($R_L$) has changed is determined by the ratio calculator 76 according to the equation:

$$F = \frac{\alpha \cdot I_{REF}}{\beta \cdot I_{PA}}.$$

Referring to the equation for the output power ($P_{OUT}$) above, since the output power ($P_{OUT}$) is inversely proportional to the load impedance ($R_L$), the factor (F) by which the load impedance ($R_L$) has changed from the ideal load is the inverse of a factor by which the output power ($P_{OUT}$) of the power amplifier circuitry 36 has changed from the output power ($P_{OUT}$) for the ideal load. To correct for the change in the output power ($P_{OUT}$) from the output power ($P_{OUT}$) for the ideal load, the value $V_{CC}^2$ is changed by the factor (F), thereby canceling the change in the load impedance ($R_L$) such that the output power ($P_{OUT}$) remains constant as the load impedance ($R_L$) changes. This is demonstrated by the following equation:

$$\frac{F \cdot V_{CC}^2}{2 \cdot F \cdot R_L} = \frac{V_{CC}^2}{2 \cdot R_L}.$$

Thus, according to the present invention, the value $V_{CC}^2$ is adjusted by the factor (F), thereby canceling the factor (F) by which the load impedance ($R_L$) changes.

Since the supply voltage ($V_{CC}$) is proportional to the adjustable power control signal ($V_{RAMP}$), the supply voltage ($V_{CC}$) is adjusted by adjusting the adjustable power control signal ($V_{RAMP}$). Thus, to adjust the value $V_{CC}^2$ by the factor (F), the factor (F) generated by the ratio calculator 76 is provided to the square root extractor 78, which provides the correction signal (√F) to the multiplier 80. As a result, the supply voltage ($V_{CC}$) is multiplied by √F, and the supply voltage ($V_{CC}$) is adjusted to offset the change in the load impedance ($R_L$) such that the output power ($P_{OUT}$) is essentially equal to the output power ($P_{OUT}$) for the ideal load as the load impedance ($R_L$) varies.

As an example, if the load impedance ($R_L$) doubles, the actual current ($I_{PA}$) decreases by a factor of 2, assuming the adjustable power control signal ($V_{RAMP}$) has not changed. Without the output power correction of the present invention, the output power ($P_{OUT}$) of the power amplifier circuitry 36 would also decrease by a factor of 2. Since the actual current ($I_{PA}$) decreases by a factor of 2, the ratio $\beta I_{REF}/\alpha I_{PA}$ is 2, the factor (F) output from the ratio calculator 76 is 2, and the correction signal output by the square root extractor 78 is equal to √2. As a result, the corrected adjustable power control signal ($V'_{RAMP}$) is equal to √2*$V_{RAMP}$. Since the supply voltage ($V_{CC}$) is proportional to $V_{RAMP}$, the supply voltage ($V_{CC}$) is also increased by a factor of √2. As a result, the value of $V_{CC}^2$ increases by a factor of 2 such that the output power ($P_{OUT}$) is corrected for the variation in the load impedance ($R_L$). More specifically, by doubling the value of $V_{CC}^2$, the doubling of the load impedance ($R_L$) is cancelled such that the output power ($P_{OUT}$) remains constant and is equal to the output power ($P_{OUT}$) for the ideal load.

Similarly, if the load impedance ($R_L$) is halved, the actual current ($I_{PA}$) increases by a factor of 2, assuming the adjustable power control signal ($V_{RAMP}$) has not changed. Without the output power correction of the present invention, the output power ($P_{OUT}$) of the power amplifier circuitry 36 would also increase by a factor of 2. Since the actual current ($I_{PA}$) increases by a factor of 2, the ratio $\beta I_{REF}/\alpha I_{PA}$ is 1/2, the factor (F) output from the ratio calculator 76 is 1/2, and the correction signal output by the square root extractor 78 is equal to $1/\sqrt{2} = \sqrt{2}/2$. As a result, the corrected adjustable power control signal ($V'_{RAMP}$) is equal to √2/2*$V_{RAMP}$. Since the supply voltage ($V_{CC}$) is proportional to $V_{RAMP}$, the supply voltage ($V_{CC}$) is also effectively multiplied by a factor of √2/2. As a result, the value of $V_{CC}^2$ is adjusted by a factor of 1/2, such that the output power ($P_{OUT}=V_{CC}^2/2R_L$) is corrected for the variation in the load impedance ($R_L$). More specifically, by halving the value of $V_{CC}^2$, the halving of the load impedance ($R_L$) is cancelled such that the output power ($P_{OUT}$) remains constant and is equal to the output power ($P_{OUT}$) for the ideal load.

FIG. 5 also illustrates an exemplary embodiment of the voltage regulator 70 previously disclosed in U.S. Pat. No.

6,701,138, wherein the voltage regulator 70 is a Low Dropout (LDO) voltage regulator. For a detailed discussion of the LDO voltage regulator, see U.S. Pat. No. 6,701,138, which has been incorporated herein by reference in its entirety. In general, the voltage regulator 70 includes an error amplifier 86, a feedback network 88, and a series pass element 90. In this embodiment, the series pass element 90 is a p-FET. The corrected adjustable power control signal ($V'_{RAMP}$) may be received by a negative input (−) of an operational amplifier forming the error amplifier 86. The output of the series pass element 90 is fed back through the feedback network 88 and received by positive input (+) of the error amplifier 86. An output signal from error amplifier 86 is provided to a control input of the series pass element 90 that controls the regulated output of voltage regulator 70.

The voltage regulator 70 regulates the supply voltage ($V_{CC}$) provided to the rails 58, 60 of the second and third amplifier stages 52, 54, respectively. The rail 62 of first amplifier stage 50 is connected directly to the fixed or primary voltage supply $V_{PRIM}$, which will preferably also be connected to the terminal for the positive potential of a battery. $V_{PRIM}$ is also preferably provided to the series pass element 90, as illustrated. As noted, the bias network 56 preferably supplies a fixed bias to the three power amplifier stages 50, 52, 54, regardless of the collector/drain voltage supplied to the second and third amplifier stages 52, 54.

In an alternative embodiment, the voltage regulator 70 may be a switching DC—DC converter, as described in commonly owned and assigned U.S. patent application Ser. No. 10/920,073, entitled POWER AMPLIFIER CONTROL USING A SWITCHING POWER SUPPLY, filed Aug. 17, 2004, which is hereby incorporated herein by reference in its entirety.

In another alternative embodiment, the voltage regulator 70 may be configurable as either an LDO voltage regulator or a switching DC—DC converter, as described in commonly owned and assigned U.S. patent application Ser. No. 11/002,473, entitled RECONFIGURABLE POWER CONTROL FOR A MOBILE TERMINAL, filed Dec. 2, 2004, which is hereby incorporated herein by reference in its entirety.

Figure 6:
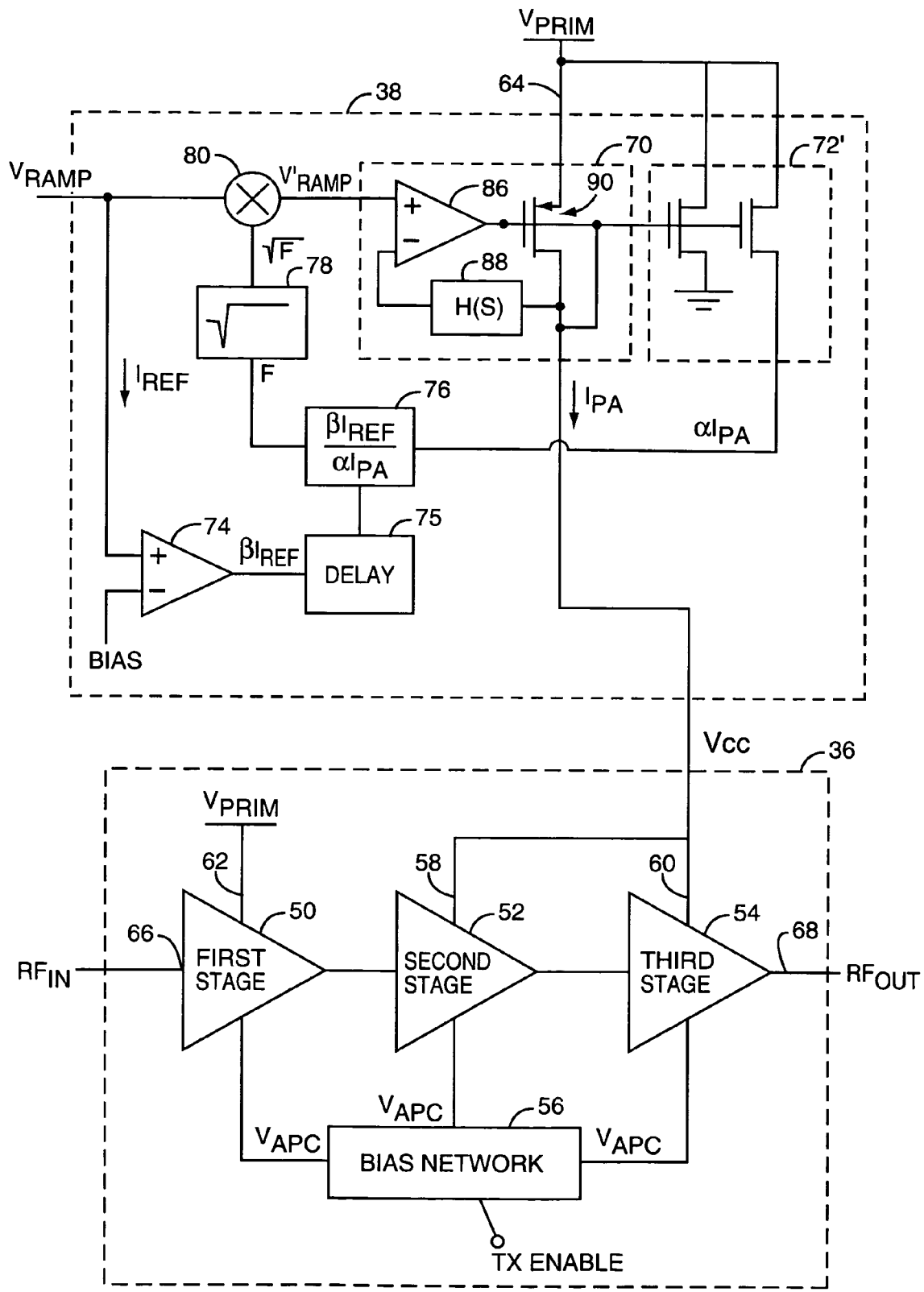
FIG. 6 illustrates the power control circuitry according to another embodiment of the present invention.

FIG. 6 illustrates another embodiment of the power control circuitry 38 of the present invention. This embodiment is substantially the same as the embodiment of FIG. 5. However, in this embodiment, the current detection circuitry 72 is a current mirror 72'. The operation of the current mirror 72' will be apparent to one of ordinary skill in the art upon reading this disclosure. In general, the current mirror 72' generates the voltage ($\alpha I_{PA}$) based on the actual current ($I_{PA}$) through the series pass element 90 of the voltage regulator 70. The current mirror 72' provides the additional advantage of not adding a voltage drop, such as the voltage drop across the resistor 82 of FIG. 5, and is easily implemented in CMOS technology.

The present invention provides substantial opportunity for variation without departing from the spirit or scope of the present invention. For example, although a specific example of the current detection circuitry 72 is illustrated in FIG. 5 and described above, the current detection circuitry 72 may be any circuit capable of determining the actual current ($I_{PA}$) provided to the power amplifier circuitry 36. As another example, the ratio calculator 76 and the square root extractor 78, referred to more generally as correction circuitry, may alternatively be replaced by correction circuitry that operates to determine the factor (F) by which the load impedance ($R_L$) has changed and provide the correction signal ($\sqrt{F}$) based on a difference between the reference current ($I_{REF}$), or some function thereof, and the actual current ($I_{PA}$), or some function thereof. As yet another embodiment, the elements of the power control circuitry 38 of FIGS. 5 and 6 other than the current detection circuitry 72, 72' and the voltage regulator 70 may be implemented in the digital domain.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   amplifier circuitry adapted to amplify a radio frequency input signal based on a supply voltage;
   power control circuitry comprising:
      voltage regulation circuitry adapted to provide the supply voltage based on a corrected adjustable power control signal;
      current detection circuitry adapted to detect an actual current provided to the amplifier circuitry from the voltage regulation circuitry and provide a signal indicative of the actual current, wherein the actual current is a function of a load impedance at an output of the amplifier circuitry;
      correction circuitry adapted to provide a correction signal based on a comparison of the signal indicative of the actual current and a signal indicative of a reference current; and
      combiner circuitry adapted to process an adjustable power control signal and the correction signal to provide the corrected adjustable power control signal.

2. The system of claim 1 wherein the correction circuitry is adapted to provide the correction signal based on the comparison of the signal indicative of the actual current and the signal indicative of the reference current such that an output power of the amplifier circuitry is essentially equal to an ideal output power corresponding to the adjustable power control signal as the load impedance varies.

3. The system of claim 1 wherein the correction circuitry is adapted to provide the correction signal based on the comparison of the signal indicative of the actual current and the signal indicative of the reference current such that, for a particular value of the adjustable power control signal, an output power of the amplifier circuitry is essentially constant and equal to an ideal output power corresponding to the particular value of the adjustable power control signal as the load impedance varies.

4. The system of claim 1 wherein the power control circuitry further comprises a means for providing the signal indicative of the reference current, and the correction circuitry comprises:
   ratio calculation circuitry adapted to provide a comparison signal based on a ratio of $\beta I_{REF}/\alpha I_{PA}$, where $\beta I_{REF}$ is the signal indicative of the reference current ($I_{REF}$), $\alpha I_{PA}$ is the signal indicative of the actual current ($I_{PA}$), and $\alpha$ and $\beta$ are predetermined numbers; and
   square root extraction circuitry adapted to provide the correction signal based on calculating a square root of the comparison signal.

5. The system of claim 4 wherein $\alpha$ and $\beta$ are predetermined such that the ratio is essentially 1 when the load impedance is equal to an ideal load impedance.

6. The system of claim 1 wherein the reference current is a function of the adjustable power control signal.

7. The system of claim 1 wherein the combiner circuitry comprises multiplier circuitry adapted to multiply the adjustable power control signal and the correction signal to provide the corrected adjustable power control signal.

8. The system of claim 1 wherein the correction circuitry is further adapted to provide the correction signal based on a difference between the signal indicative of the actual current and the signal indicative of the reference current.

9. A method comprising:

providing amplifier circuitry for amplifying a radio frequency input signal based on a supply voltage;

providing the supply voltage based on a corrected adjustable power control signal;

providing a signal indicative of an actual current provided to the amplifier circuitry by providing the supply voltage, wherein the actual current is a function of a load impedance at an output of the amplifier circuitry;

providing a correction signal based on a comparison of the signal indicative of the actual current and a signal indicative of a reference current; and processing an adjustable power control signal and the correction signal to provide the corrected adjustable power control signal.

10. The method of claim 9 wherein providing the correction signal based on the comparison of the signal indicative of the actual current and the signal indicative of the reference current provides the correction signal such that an output power of the amplifier circuitry is essentially equal to an ideal output power corresponding to the adjustable power control signal as the load impedance varies.

11. The method of claim 9 wherein providing the correction signal based on the comparison of the signal indicative of the actual current and the signal indicative of the reference current provides the correction signal such that, for a particular value of the adjustable power control signal, an output power of the amplifier circuitry is essentially constant and equal to an ideal output power corresponding to the particular value of the adjustable power control signal as the load impedance varies.

12. The method of claim 9 further comprising providing the signal indicative of the reference current, and providing the correction signal comprises:

providing a comparison signal based on a ratio of $\beta I_{REF}/\alpha I_{PA}$, where $\beta I_{REF}$ is the signal indicative of the reference current ($I_{REF}$), $\alpha I_{PA}$ is the signal indicative of the actual current ($I_{PA}$), and $\alpha$ and $\beta$ are predetermined numbers; and providing the correction signal based on calculating a square root of the comparison signal.

13. The method of claim 12 wherein $\alpha$ and $\beta$ are predetermined such that the ratio is essentially 1 when the load impedance is equal to an ideal load impedance.

14. The method of claim 9 further comprising providing the signal indicative of the reference current based on the reference current, wherein the reference current is a function of the adjustable power control signal.

15. The method of claim 9 wherein processing the adjustable power control signal and the correction signal comprises multiplying the adjustable power control signal and the correction signal to provide the corrected adjustable power control signal.

16. The method of claim 9 wherein providing the correction signal comprises providing the correction signal based on a difference between the signal indicative of the actual current and the signal indicative of the reference current.

17. A system comprising:

means for amplifying a radio frequency input signal based on a supply voltage;

means for providing the supply voltage based on a corrected adjustable power control signal;

means for providing a signal indicative of an actual current provided to the means for amplifying by the means for providing the supply voltage, wherein the actual current is a function of a load impedance at an output of the means for amplifying;

means for providing a correction signal based on a comparison of the signal indicative of the actual current and a signal indicative of a reference current; and means for processing an adjustable power control signal and the correction signal to provide the corrected adjustable power control signal.

18. The system of claim 17 wherein the means for providing the correction signal based on the comparison of the signal indicative of the actual current and the signal indicative of the reference current provides the correction signal such that an output power of the means for amplifying is essentially equal to an ideal output power corresponding to the adjustable power control signal as the load impedance varies.

19. The system of claim 17 wherein the means for providing the correction signal based on the comparison of the signal indicative of the actual current and the signal indicative of the reference current provides the correction signal such that, for a particular value of the adjustable power control signal, an output power of the means for amplifying is essentially constant and equal to an ideal output power corresponding to the particular value of the adjustable power control signal as the load impedance varies.

20. The system of claim 17 further comprising means for providing the signal indicative of the reference current, and the means for providing the correction signal comprises:

means for providing a comparison signal based on a ratio of $\beta I_{REF}/\alpha I_{PA}$, where $\beta I_{REF}$ is the signal indicative of the reference current ($I_{REF}$), $\alpha I_{PA}$ is the signal indicative of the actual current ($I_{PA}$), and $\alpha$ and $\beta$ are predetermined numbers; and means for providing the correction signal based on calculating a square root of the comparison signal.

* * * * *